United States Patent [19]

Matsui et al.

[11] Patent Number: 4,727,325
[45] Date of Patent: Feb. 23, 1988

[54] NMR IMAGING METHOD

[75] Inventors: Shigeru Matsui, Koganei; Kensuke Sekihara, Hachioji; Hideki Kohno, Tokyo, all of Japan

[73] Assignee: Hitachi, Ltd., Tokyo, Japan

[21] Appl. No.: 919,767

[22] Filed: Oct. 16, 1986

[30] Foreign Application Priority Data

Oct. 16, 1985 [JP] Japan .................. 60-228679
Oct. 16, 1985 [JP] Japan .................. 60-228687

[51] Int. Cl.$^4$ .......................................... G01R 33/20
[52] U.S. Cl. ........................................ 324/309; 324/312
[58] Field of Search .............. 324/307, 309, 311, 312

[56] References Cited

U.S. PATENT DOCUMENTS 4,307,343 12/1981 Likes .................................. 324/309
4,642,567 2/1987 Kaplan ............................... 324/309
4,651,096 3/1987 Buonocore ......................... 324/309

OTHER PUBLICATIONS

Hinshaw, W., "Image Formation by Nuclear Magnetic Resonance: The Sensitive-Point Method", J. App. Phys., vol. 47, No. 8, Aug. 1976.

Ljunggren, S., "A Simple Graphical Representation of Fourier-Based Imaging Methods", J. Mag. Res. 54, pp. 338–343, 1983.

Kumar et al., "NMR Fourier Zeumatography", J. Mag. Res. 13, pp. 69–83, 1975.

*Primary Examiner*—Stewart J. Levy
*Assistant Examiner*—Kevin D. O'Shea
*Attorney, Agent, or Firm*—Antonelli, Terry & Wands

[57] ABSTRACT

An NMR imaging method using a rotating field gradient is disclosed in which transverse magnetization is prepared in a portion of an object to be inspected, by the 90°–180° RF pulse excitation, a rotating field gradient is generated to perform a sampling operation for an output signal in a state that the position of signal in a phase space is revolved, the intensity or rotational speed of the rotating field gradient is varied stepwise or continuously to obtain data arranged on concentric circles or a spiral in the phase space, and the data thus obtained undergoes Fourier transformation in each of a plurality of radial directions or two-dimensional Fourier transformation, to form an image of spin distribution.

16 Claims, 23 Drawing Figures

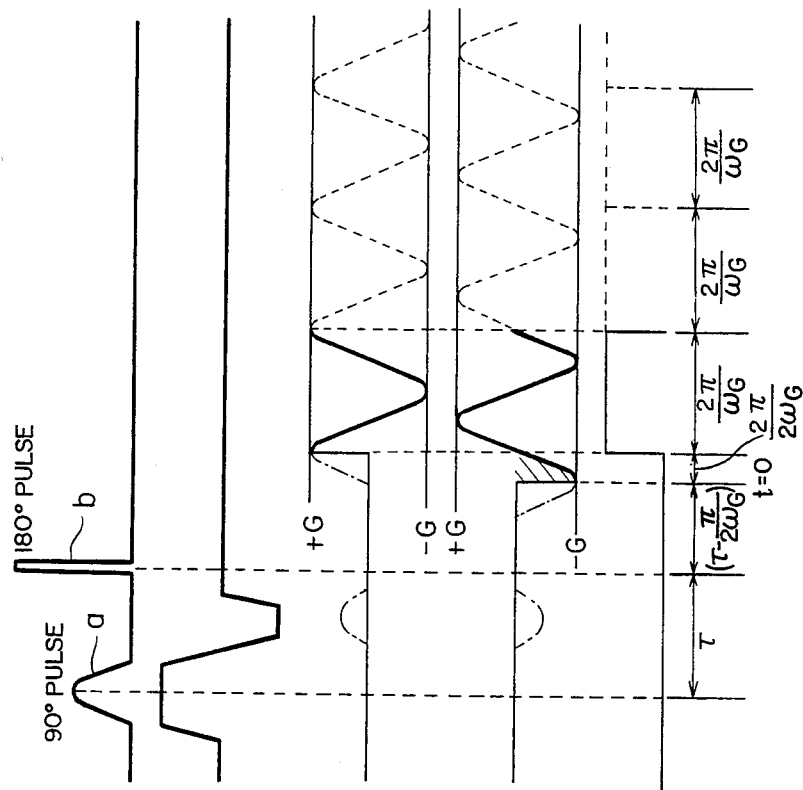

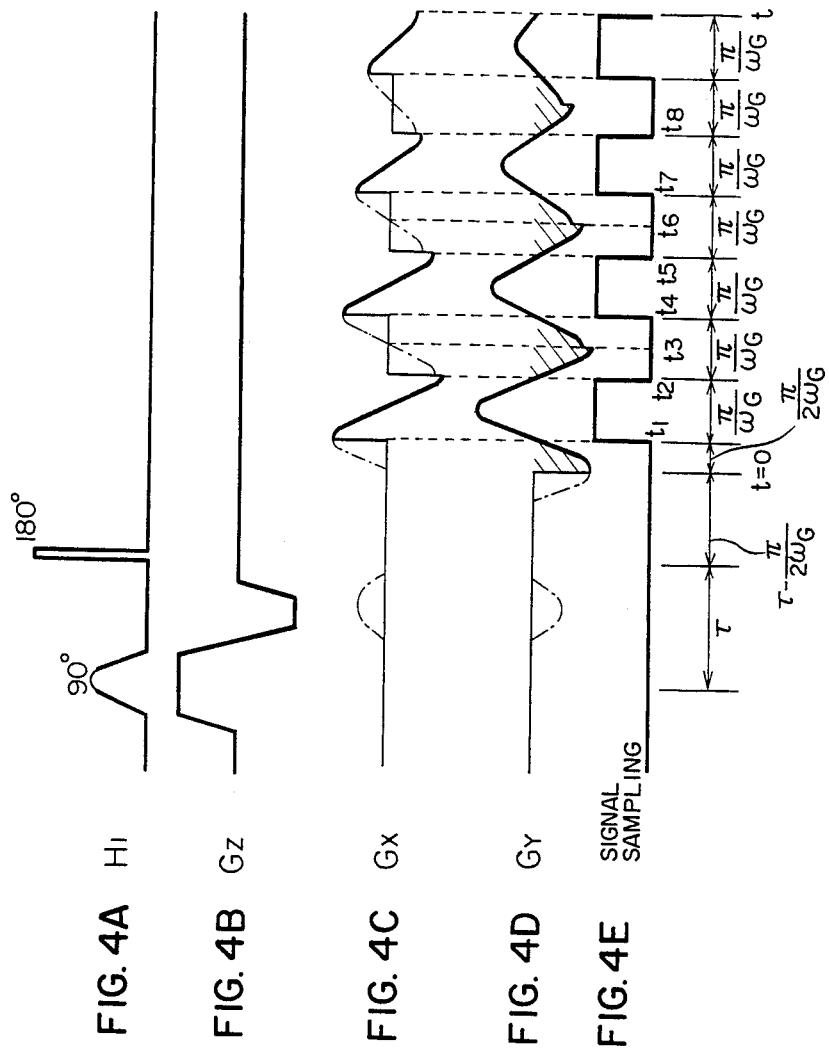

NMR IMAGING METHOD

BACKGROUND OF THE INVENTION

The present invention relates to a measuring method using magnetic resonance, and more particularly to a spin mapping method suited for measuring the spatial distribution of nuclear spins.

As a fundamental spin mapping method, the projection reconstruction method and the Fourier zeugmatographic method have hitherto been known. The former is published in an article (Nature, Vol. 242, 1973, page 190), and the latter is published in an article (J. of Magnetic Resonance, Vol. 18, 1975, page 69). In these methods, it is the fundamental thought to form the projection of spin distribution in a specified direction, that is, the direction of field gradient is fixed during a signal measurement.

SUMMARY OF THE INVENTION

According to the present invention, there is provided an imaging method using a novel spin mapping method in which signal measurements are performed while rotating the field gradient.

In the above-mentioned projection reconstruction method, a plurality of signal measurements are performed in different projective directions. Further, in the Fourier zeugmatographic method, a plurality of signal measurements are performed for different phase encoding values. In these methods, the precision of reconstructed image, that is, the number of image matrices depends upon the number of signal measurements. Accordingly, in order to obtain a reconstructed image having high precision, it is necessary to measure a body to be inspected, for a fairly long time. Further, in order to vary the precision of the reconstructed image, it is necessary to vary the number of increments of the projection angle or the phase encoding, and to perform a corresponding number of measuring operations, that is, complicated, cumbersome processing is required.

It is therefore an object of the present invention to provide an imaging method in which the measuring time is shorter than the usual method.

It is another object of the present invention to provide an imaging method in which the precision of reconstructed image can be readily varied.

According to one aspect of the present invention, an NMR imaging method (namely, nuclear magnetic resonance imaging method) includes a first step of preparing transverse magnetization of a desired portion of an object, which is disposed in a uniform, static magnetic field and is to be inspected, a second step of generating a field gradient in a predetermined direction to translate the position of signal in a phase space to appropriate locations, and a third step of generating a rotating field gradient to perform a measuring operation while the position of signal traces are circular in the phase space.

According to another aspect of the present invention, an NMR imaging method includes a step of preparing transverse magnetization of a desired portion of an object, which is disposed in a uniform, static magnetic field and is to be inspected, and another step of performing a measuring operation while the position of signal in a phase space traces are spiral.

BRIEF DESCRIPTION OF THE DRAWINGS

FIGS. 2A to 2E are time charts showing the measuring sequence of an embodiment of an imaging method according to the present invention.

FIGS. 4A to 4E are time charts showing the measuring sequence of another embodiment of an imaging method according to the present invention.

DESCRIPTION OF THE PREFERRED EMBODIMENTS

Figure 1:
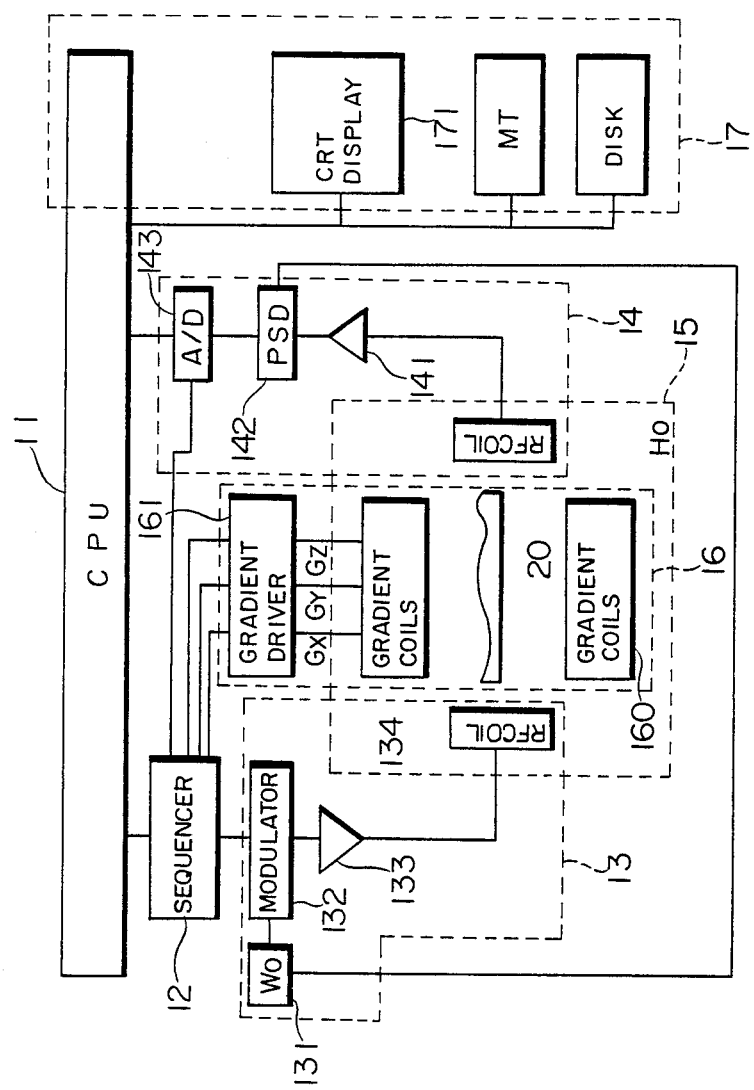
FIG. 1 is a block diagram showing an apparatus for realizing the present invention.

Prior to embodiments of the present invention, two-dimensional spin mapping according to the present invention will be explained, by way of example. Now, let us assume that transverse magnetization of an object is prepared which is disposed in a uniform, static magnetic field and is to be inspected, at a time t=0. At this time, a rotating field gradient vector $\vec{G}_r(t)$ is generated which is expressed by the following equation:

$$\vec{G}_r(t) = G(i\cos\omega_G t + j\sin\omega_G t) \ldots \quad (1)$$

where $\omega_G$ indicates an angular velocity, at which the field gradient vector is rotated. A spin signal, i.e. transverse magnetization, M(t) which is observed under the influence of the above field gradient is given by the following equation:

$$M(t) = \iint \rho(x,y) \exp\left[ i\gamma r \int_0^t G_r(t')dt' \right] dxdy \quad (2)$$

-continued $$= \iint \rho(x,y) \exp\left[ i \frac{\gamma G}{\omega_G} \{X\sin\omega_G t + y(1 - \cos\omega_G t)\} \right] dxdy$$

where $\rho(x,y)$ indicates spin distribution, and $\gamma$ the gyromagnetic ratio of nuclear spin. Now, let us consider a phase space having coordinates $k_x$ and $k_y$ which are given by the following equations:

$$\left. \begin{array}{l} k_x(t) = \dfrac{\gamma G}{\omega_G} \sin\omega_G t \\ k_y(t) = \dfrac{\gamma G}{\omega_G} (1 - \cos\omega_G t) \end{array} \right\} \quad (3)$$

Then, the spin signal M(t) is rewritten as follows:

$$M(k_x,k_y) = \iint \rho(x,y)\exp[i\{xk_x + yk_y\}]dxdy \ldots \quad (4)$$

The equation (4) shows the location of the spin signal in the phase space at a time t.

From the equations (3), we can obtain the following equation:

$$k_x^2 + \left(k_y - \frac{\gamma G}{\omega_G}\right)^2 = \left(\frac{\gamma G}{\omega_G}\right)^2.$$

Accordingly, the locus of the position of signal in the phase space is given by a circle having the center thereof at a point (0, $\gamma G/\omega G$) and having a radius $\gamma G/\omega G$. This suggests that, when the center of the circle is translated to the origin of the phase space in an appropriate manner, the measured signal will directly give circular phase information symmetrical with respect to the phase origin. Such translation of the above center can be readily realized. After the above translation of the center of the circle, a measuring operation is performed while varying the radius of the circle stepwisely by appropriately varying one or both of the gradient amplitude G and the angular velocity $\omega_G$. Thus, phase information having the form of concentric circles with center at the phase origin can be obtained. The whole information thus obtained is identical to the whole information obtained by the conventional projection reconstruction method. Accordingly, after the information on a diameter is Fourier transformed and is then subjected to back projection, spin distribution will be obtained. Further, even when the position of signal in the phase space is moved so as to draw concentric semi-circles, necessary information will be obtained. In the present method, spin distribution is projected onto a specified circumference (namely, circle) in the phase space. Accordingly, the present method can be called "the projection reconstruction method in phase space". A main feature of the present method resides in that the signal on a circle having a long diameter is the collection of tail portions of a series of free induction decay signals (namely, FID signals) measured in the conventional projection reconstruction method. The signal on a circle having a short diameter corresponds to the head portions of a series of FID signals. Hence, the present method has various advantages. That is, simply by changing the sampling rate for the outputted signal, the number of data sampled in the phase space is changed. This leads to changing the signal density in the phase space. Accordingly, the precision of the reconstructed image can be changed more readily in the present method than in the conventional projection reconstruction method. Further, in the present method, the measured FID signal obtained along the radius is not affected by the non-uniformity of the static magnetic field and the transverse relaxation, provided that the gradient amplitude is incremented as a measurement parameter while the rotation frequency is fixed. Accordingly, the FID signal is never distorted by those effects, and a high spatial resolution is obtained.

Now, explanation will be made on embodiments of an imaging method according to the present invention.

FIG. 1 is a block diagram showing an apparatus for carrying out the present invention. Referring to FIG. 1, the above apparatus is made up of a sequencer 12 operated under the control of a central processing unit (CPU) 11, a transmitting unit 13, a receiving unit 14, a field gradient generating unit 16, a signal processing unit 17, and a static field generating magnet 15. The magnet 15 forms a uniform, static magnetic field $H_0$ in a space in which an object 20 to be inspected is placed. The sequencer 12 sends various instructions necessary for an imaging method according to the present invention, to the above units. The transmitting unit 13 includes a high frequency oscillator 131, a modulator 132 and a high frequency amplifier 133, to apply a high frequency coil (that is, an RF coil) 134 with an RF pulse which has been subjected to amplitude modulation in accordance with an instruction from the sequencer 12, thereby applying an RF magnetic field $H_1$ to the to-be-inspected object 20. The field gradient generating unit 16 is made up of gradient coils 160 having axes parallel to X-, Y- and Z-directions and gradient drivers 161 for exciting the gradient coils 160, to form a field strength gradient in the X-, Y-and Z-directions in accordance with instructions from the sequencer 12. The field gradients in the X-, Y- and Z-directions will hereinafter expressed by $G_x$, $G_y$ and $G_z$, respectively. An NMR signal observed under the application of the gradient fields is supplied to the receiving unit 14 through the RF coil 134. The receiving unit 14 includes an amplifier 141, a phase shift detector 142 and an A/D converter 143, and supplies the signal processing unit 17 with data which is sampled at the timing indicated by an instruction from the sequencer 13. The signal processing unit 17 carries out various processing such as Fourier transformation and image reconstruction, that is, performs appropriate operations for one or a plurality of detected signals, to obtain the spatial distribution of nuclear spins and to display the image of the spin distribution by means of, for example, a CRT display 171.

FIGS. 2A to 2E show a pulse sequence used in an embodiment of an imaging method for measuring the spin distribution at a cross section of a to-be-inspected object in accordance with the present invention. FIG. 2A shows two pulsive RF magnetic fields applied to the to-be-inspected object. It is to be noted that FIG. 2 shows only the positive portion of the envelope of each of the RF magnetic fields. FIGS. 2B, 2C and 2D show the field gradients in the Z-, X- and Y-directions, respectively. FIG. 2E shows signal sampling periods. In FIGS. 2C and 2D, dot-dash lines indicate dummy field gradients which are generated to solve the problem that a definite time is required to generate a field gradient. In a case where the apparatus shows an ideal response, the dummy field gradients, which are needed in real situations, are not necessary. Accordingly, the following explanation will be made on an ideal sequence indicated by solid lines, for the sake of simplicity.

In order to prepare the transverse magnetization of nuclear spins, 90°-180° RF pulse excitation is carried out. That is, a frequency-limited, 90° RF pulse a is applied to the object through the RF coil 134 in a state that the field gradient $G_z$ is generated, to excite nuclear spins in a specified slice of the to-be-inspected object. When a time $\tau$ has elapsed after the peak of the 90° RF pulse a, a 180° RF pulse b is applied, to reverse the directions of nuclear spins. Thus, when a time $\tau$ has elapsed after the 180° RF pulse b (that is, at a time $t=\pi/2\omega_G$), the transverse magnetization is prepared. If each of the field gradients $G_x$ and $G_y$ is equal to zero and the static magnetic field $H_0$ is completely uniform, the phase coordinate of the outputted signal will be (0, 0) at the time $t=\pi/2\omega_G$. In fact, as shown in FIG. 2D, a field gradient $G_y$ is generated for the translation of the signal phase at a time $t=0$, which is given by the following equation:

$$G_y = G\sin\left\{\omega_G\left(t - \frac{\pi}{2\omega_G}\right)\right\}. \tag{5}$$

Further, a field gradient $G_x$ in the X-direction is generated at the time $t=\pi/2\omega_G$, which is given by the following equation:

$$G_x = G\cos\left\{\omega_G\left(t - \frac{\pi}{2\omega_G}\right)\right\}. \tag{6}$$

Figure 3A:
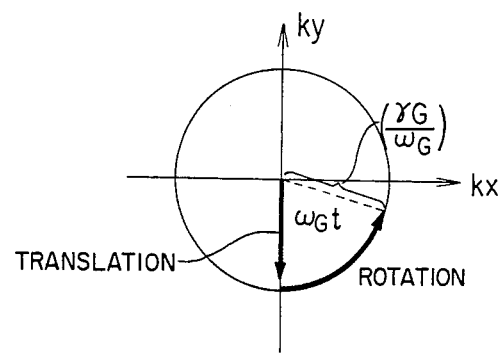
FIGS. 3A and 3B are schematic diagrams showing those loci of the position of signal in a phase space which are formed in the embodiment of FIGS. 2A to 2E.

After the time $t=\pi/2\omega_G$, a sampling operation starts for the outputted signal. Accordingly, the resultant field gradient will have an intensity G and rotate at the angular frequency $\omega_G$, during a sampling period. Now, let us consider the measuring operation, in the phase space $(k_x, k_y)$. As shown in FIG. 3A, the phase coordinate of the signal (namely, the outputted signal) is moved on the $k_y$-axis from $k_y=0$ to $k_y=-(\gamma G/\omega_G)$, in a period from $t=0$ to $t=\pi/2\omega_G$ (that is, a period when only the field gradient $G_y$ is generated). Thereafter, the resultant field gradient is rotated, and the phase coordinate of signal moves on a circle which has the center thereof at the origin of the phase space and has a radius $\gamma G/\omega_G$, during the rotating field gradient is present.

Figure 3B:
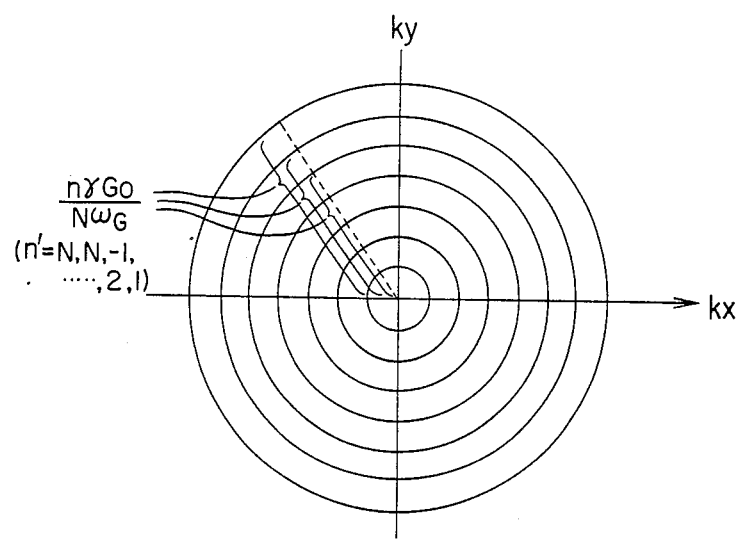

The above sequence is the fundamental sequence of the present invention. In order to measure the spin distribution in the to-be-inspected object, the measuring sequence shown in FIGS. 2A to 2E is repeated while varying one of the intensity G of field gradient or the angular frequency $\omega_G$ stepwise. Thus, phase information having the form of concentric circles shown in FIG. 3B is obtained. For example, when the value of G is made equal to $G_0$, $$\frac{G_0(N-1)}{N},$$

-----, and $G_0/N$, concentric circles arranged at regular intervals are formed in the phase space, as shown in FIG. 3B. Alternatively, the sequence of FIGS. 2A to 2E may be repeated while varying the angular frequency $\omega_G$ stepwise. Further, the above sequence may be repeated while varying both the intensity G of field gradient and the angular frequency $\omega_G$. The field gradient may be continuously rotated a plurality of times in one measuring operation as indicated by broken lines in FIGS. 2C and 2D, to accumulate data sampled in each rotational period.

Further, the dummy field gradients indicated by dot-dash lines in FIGS. 2C and 2D, may be generated. In this case, the integration of the intensity of the dummy field gradient $G_x$ in a period prior to the 180° RF pulse, is made equal to the integration of the intensity of the dummy field gradient $G_x$ in a period from $t=0$ to $t=\pi/2\omega_G$. Accordingly, the effect of the dummy field gradient $G_x$ in the period prior to the 180° RF pulse is cancelled by the effect of the dummy field gradient $G_x$ in a period after the 180° RF pulse, at the time $t=\pi/2\omega_G$. Thus, the same operation as in a case where only the field gradient $G_x$ indicated by the solid line is used, will be performed. Further, the integration of the intensity of the dummy field gradient $G_y$ in the period prior to the 180° RF pulse b is made equal to the integration of the intensity of the dummy field gradient $G_y$ in a period from the application time of the 180° RF pulse b to the time $t=0$. Thus, the same operation as in a case where only the field gradient $G_y$ indicated by the solid line is used, will be performed. As shown in FIGS. 2C and 2D, when the dummy field gradients are used, it is unnecessary to generate the field gradients $G_x$ and $G_y$ with desired values abruptly at a time $t=0$ and a time $t=\pi/2\omega_G$, respectively.

Phase information on concentric circles which is obtained by repeating the measuring sequence of FIGS. 2A to 2E, is equivalent to information which is obtained by repeating a measuring sequence according to the conventional projection reconstruction method a plurality of times. Accordingly, image reconstruction processing is carried out for the phase information on the concentric circles, in the signal processing unit 17 of FIG. 1, to obtain an image of the spin distribution in the to-be-inspected object. In a method for image reconstruction, data on the concentric circles are Fourier transformed along each of radial directions and then subjected to back projection, to form a two-dimensional image. The number of projections used in back projection depends upon the number of data sampled in each measuring operation. Accordingly, the number of projections can be freely increased by increasing the number of data sampling in each measuring operation. In another method for image reconstruction, data at rectangular coordinate points in the phase space is obtained from data on the concentric circles of FIG. 3B by two-dimensional interpolation, and undergoes two-dimensional Fourier transformation, to obtain a desired image.

In the above-mentioned embodiment, a sequence composed of spin excitation and measurement has to be repeated a plurality of times, to know the spin distribution. However, after the spin excitation, a more complicated operation can be performed, that is, it is possible to translate the position of signal in the phase space, and then rotate the field gradient a plurality of times while varying one of G and $\omega_G$. Thus, the whole information on spin distribution can be obtained by one continuous sequence, and a measuring time is shortened in a great degree.

FIGS. 4A to 4E show an example of such a sequence, that is, the measuring sequence of another embodiment of an imaging method according to the present invention, and correspond to FIGS. 2A to 2E, respectively.

Figure 5A:
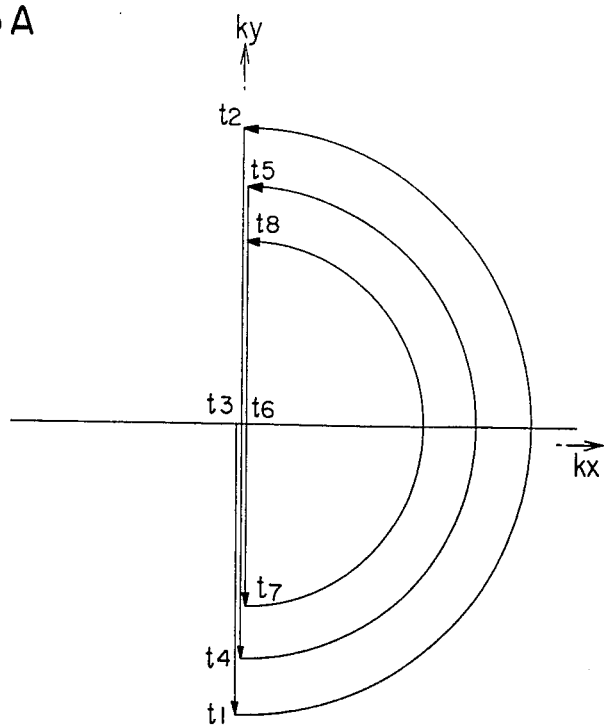
FIGS. 5A and 5B are schematic diagrams showing those loci of the position of signal in a phase space which are formed in the embodiment of FIGS. 4A to 4E.

The sequence of FIGS. 4A to 4E is identical with the sequence of FIGS. 2A to 2E, in a period prior to a time $t_2$ (namely, $t=3\pi/2\omega_G$). That is, the transverse magnetization due to nuclear spins is prepared by means of the 90° RF pulse and the 180° RF pulse. Next, the field gradient $G_y$ is generated at a time $t=0$, to translate the phase coordinate of signal from $k_y=0$ to $k_y=-\gamma G/\omega_G$ in a period from the time $t=0$ to a time $t=\pi/2\omega_G$ (namely, a time $t_1$). In a period from the time $t_1$ to a time $t_2$ (namely, a time $t=3\pi/2\omega_G$), a sampling operation is performed in a state that field gradients $G_x=G\cos\{\omega_G(t-\pi/2\omega_G)\}$ and $G_y=G\sin\{\omega_G(t-\pi/2\omega_G)\}$ are generated. Accordingly, the phase coordinate of the signal moves on a circle having a radius $\gamma G/\omega_G$ through an angle of 180°. In a period from the time $t_2$ and a time $t_3$ (namely, a time $t=2\pi/\omega_G$), the field gradient $G_x$ is made equal to zero and only the field gradient $G_y$ is generated, to translate the phase coordinate of the signal to the origin along the $k_y$-axis. Thereafter, the above sequence is repeated while varying the amplitude $G$ of the field gradients $G_x$ and $G_y$. That is, a sequence composed of the translation and rotation of phase coordinate is repeated while varying the radius of circle. FIG. 5A shows the locus of phase coordinate in this above case.

Figure 5B:
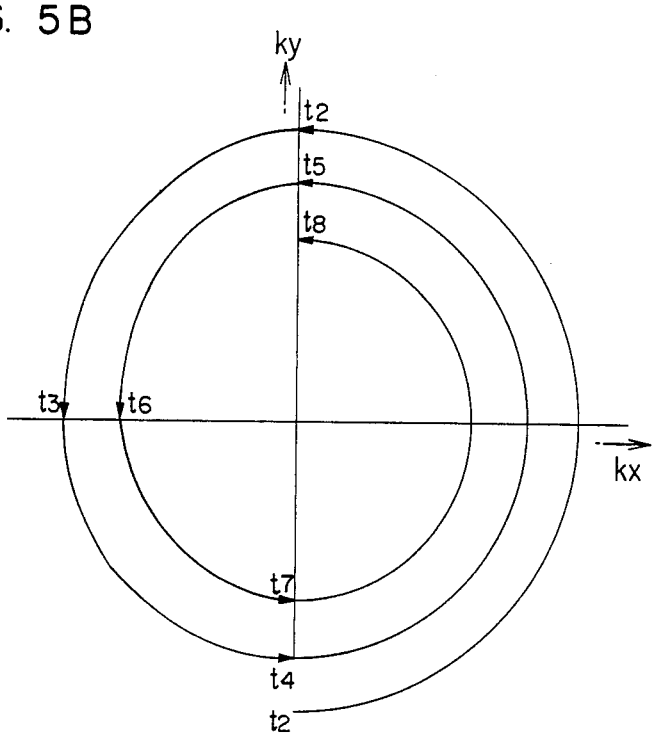

In the sequence of FIGS. 4A to 4E, each of the field gradients $G_x$ and $G_y$ may have a waveform which is indicated by the combination of a dot-dash line and a solid line. In this case, the locus of phase coordinate in each of a period from the time $t_2$ to a time $t_4$ and a period from a time $t_5$ to a time $t_7$ does not form a straight line but forms a circular arc. FIG. 5B shows the locus of phase coordinate in this case. In FIG. 5B, the above locus in a region where $k_x$ is greater than zero, is identical with that shown in FIG. 5A. Accordingly, data is sampled on the locus in the region of $k_x \geq 0$. In a case where the field gradients $G_x$ and $G_y$ each indicated by the combination of a dot-dash line and a solid line in FIGS. 4C and 4D are used, the field gradients change gradually. Accordingly, such a sequence is preferable from the practical point of view, and moreover can produce the same result as in a case where field gradients $G_x$ and $G_y$ indicated by only solid lines are used.

Figure 6:
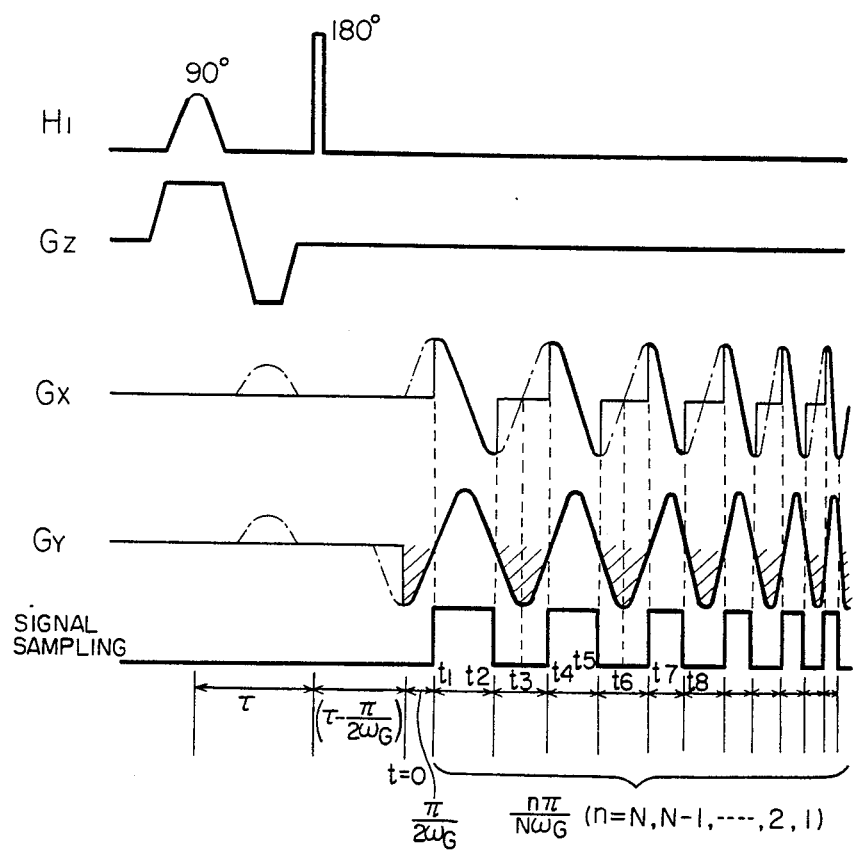
FIG. 6 is a time chart showing the measuring sequence of a further embodiment of an imaging method according to the present invention.

FIG. 6 shows the measuring sequence of a further embodiment of an imaging method according to the present invention. Unlike the embodiment of FIGS. 4A to 4E in which a sequence composed of the translation, revolution and rotation of phase coordinate is repeated while varying the amplitude of field gradient waveform, the present embodiment repeats the above sequence while varying the angular frequency $\omega_G$. In the present embodiment, also, field gradients $G_x$ and $G_y$ each indicated by the combination of a dot-dash line and a solid line can be used. In this case, the field gradient changes gradually, and thus practical measurement can be made. The locus of phase coordinate obtained when field gradients indicated by only solid lines in FIG. 6 are used, and the locus of phase coordinate obtained when field gradients $G_x$ and $G_y$ each indicated by the combination of a dot-dash line and a solid line in FIG. 6 are used, are similar to the locus of FIG. 5A and the locus of FIG. 5B, respectively.

Although one of $G$ and $\omega_G$ is changed in the embodiment of FIGS. 4A to 4E and the embodiment of FIG. 6, a measuring operation may be performed while varying both of $G$ and $\omega_G$.

In the embodiments of FIGS. 4A to 4E and FIG. 6, the phase coordinate of the signal is moved on a plurality of semicircular arcs having different radii, by a continuous sequence following the spin excitation. Accordingly, as explained in the embodiment of FIGS. 2A to 2E, data on the semicircular arcs is Fourier transformed along each of radial directions and then subjected to back projection, to form an image of spin distribution. The measuring time is far shorter in the embodiments of FIGS. 4A to 4E and FIG. 6 than in the embodiment of FIG. 2A to 2E.

In the above embodiments, the effect of transverse relaxation may appear in a period from the spin excitation to the end of signal detection. It is to be noted that, in the embodiments of FIGS. 4A to 4E and FIG. 6, the scanning area in the phase space by the sequence composed of the translation and rotation of phase coordinate is one-half the whole K area in order to make the measuring time as short as possible. However, the scanning area in the above sequence may be the whole area.

Even in a case where the transverse relaxation time $T_2$ is short, if a measuring sequence is carried out so that the radius of circle or semicircular arc decreases as shown in FIGS. 5A and 5B, the transverse relaxation effect acts as a sort of high-pass filter, and a high-quality image can be obtained without making the full deconvolution necessary for back projection.

In the embodiments of FIGS. 4A to 4E and FIG. 6, the whole phase information is continuously measured after the spin excitation. However, the above phase information is divided into a plurality of parts. That is, after spin excitation, a measuring operation is performed while varying one of $G$ and $\omega_G$ so that only a few concentric circles are drawn by the phase coordinate of signal. The combination of the spin excitation and the above measuring operation is repeated a plurality of times, to obtain the whole of required phase information. According to the above method, the effect of transverse relaxation is weakened, and moreover a measuring time becomes shorter than that in the embodiment of FIGS. 2A to 2E, 3A and 3B.

Figure 7:
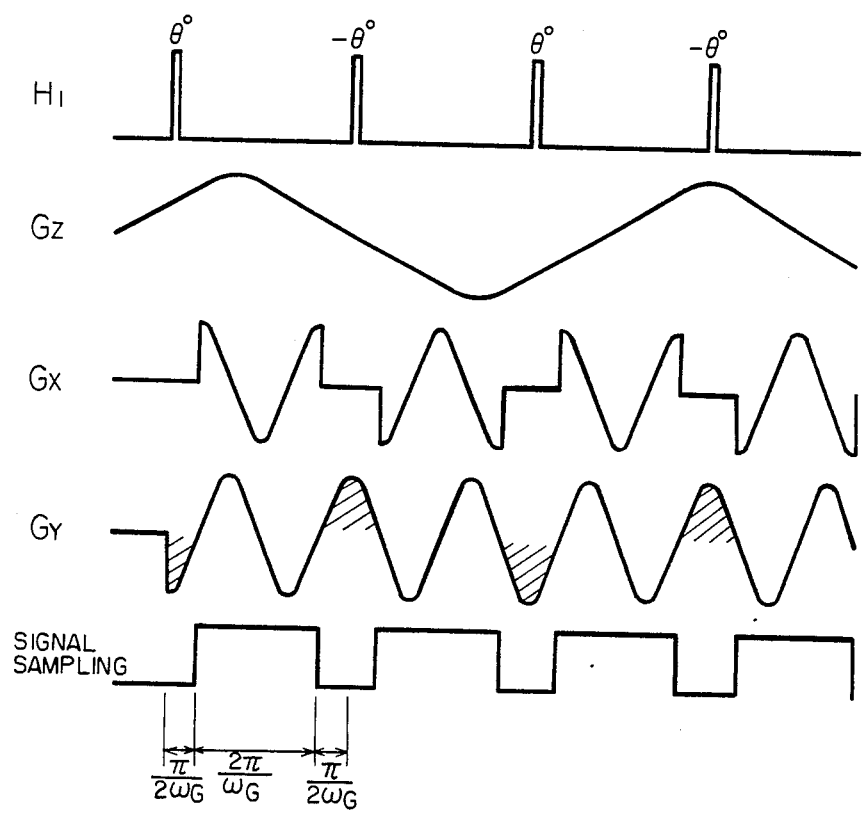
FIG. 7 is a time chart showing the measuring sequence of a different embodiment of an imaging method according to the present invention.

FIG. 7 shows the measuring sequence of a different embodiment of an imaging method according to the present invention. The present embodiment is the combination of an imaging method according to the present invention and the steady-state free precession method which is described in, for example, an article (J. of Applied Physics, Vol. 47, 1976, page 3709). In the present embodiment, a periodically oscillating field gradient $G_z$ is applied for slice selection, and a plurality of RF pulses which have positive and negative polarities alternately, are applied to the object through the RF coil. Further, each of field gradients $G_x$ and $G_y$ oscillates with a constant value of $G$ and $\omega_G$, so that the phase coordinate of signal repeats the combination of translation and rotation, and data sampled in the period of rotation are summed up at high speed. Further, the above processing is repeated for different values of $G$. The present embodiment can solve the problem that, in the conventional steady-state free precession method, the saturation of a receiver occurs immediately after an RF pulse.

Next, explanation will be made of various embodiments in which a signal is measured on a spiral which is formed in the phase space and starts from the origin thereof. Accordingly, the embodiments are different from the embodiments having been explained by reference to FIGS. 1 to 6, in that the translation of phase coordinate prior to the rotation thereof is not required.

Now, let us consider a case where two-dimensional imaging using a (x,y)-plane as an imaging plane is carried out, and a field gradient is given by the following equations.

$$G_x(t) = G_0\cos\omega_G t - G_0\omega_G t\sin\omega_G t \brace G_y(t) = G_0\sin\omega_G t + G_0\omega_G t\cos\omega_G t \quad (8)$$

In this case, a nuclear magnetic resonance signal S(t) is expressed by the following equation:

$$S(t) = \int \rho(x,y)\exp[i\gamma\{G_0 t(x\cos\omega_G t + y\sin\omega_G t)\}]dxdy \quad (9)$$

Figure 8:
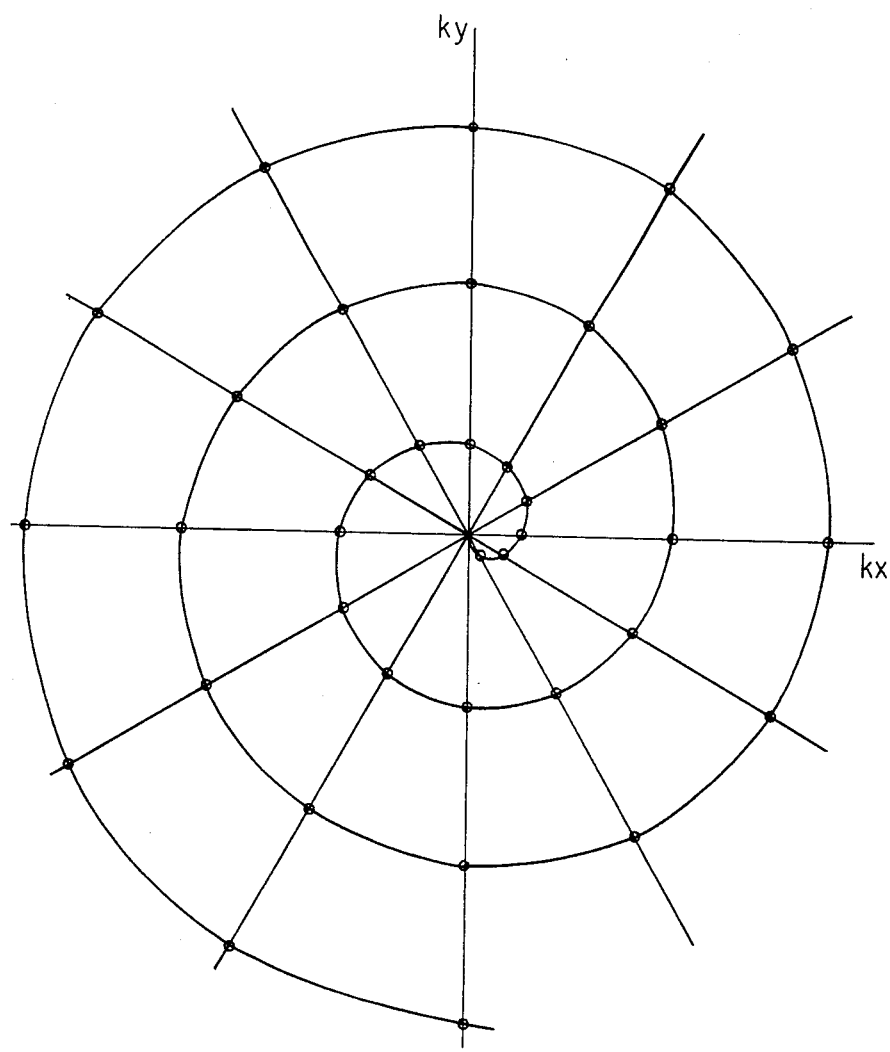
FIG. 8 is a schematic diagram showing that locus of the position of signal in a phase space which is formed in still another embodiment of an imaging method according to the present invention.

A data train obtained from the equation (9) shows data sampled on such a spiral in phase space as shown in FIG. 8. The sampling in a phase space (or Fourier space) is suggested in an article (Journal of Magnetic Resonance, Vol. 54, 1983, pages 338 to 343). However, this article does not contain the detailed discussion of an image reconstruction method and others. According to the present invention, there are provided a method of reconstructing an image from data on the spiral, a method of sampling data used for image reconstruction, and a measuring method capable of driving a field gradient without casting a heavy burden upon the gradient driver.

The image reconstruction will first be explained. The sampling interval for outputted signal, that is, the sampling interval $\Delta t$ of an A/D converter for digitizing the outputted signal to apply a digital signal to a computer, is selected so as to satisfy an equation $\Delta\omega t = 2\pi/M$ (where M is an integer). Thus, as shown in FIG. 8, measuring points are arranged on each of straight lines which make an angle $\theta$ with the $k_x$-axis, at regular intervals. (In FIG. 8, sampling points are denoted by reference symbol ○.)

A time when the spiral intersects with the straight lines, is given by the following equation:

$$t_n^\theta = \frac{\theta}{\omega_G} + \frac{2n\pi}{\omega_G} \quad (n = 0, 1, 2, \ldots). \quad (10)$$

By substituting $t_n^\theta$ into the equation (9), we can obtain the following equation:

$$S(t_n^\theta) = \int \rho(x,y)\exp[i\rho\{G_0 t_n^\theta(x\cos\theta + y\sin\theta)\}]dxdy. \quad (11)$$

When $t_n^\theta$ is regarded as a continuous variable and expressed by $t^\theta$, the equation (11) is rewritten as follows:

$$S(t^\theta) = \left\{1 + \text{sgn}\left(t - \frac{\theta}{\omega_G}\right)\right\} \int \rho(x,y)\exp[i\gamma\{G_0 t^\theta(x\cos\theta + y\sin\theta)\}]dxdy \quad (13)$$

where sgn (t) = 1 for $t \geq 0$
       = $-1$ for $t < 0$.

The above $S(t^\theta)$ indicates a data group arranged on a radius vector which makes an angle $\theta$ with the $k_x$-axis. In a case where an arithmetic operation is performed with respect to $t^\theta$, data on the spiral is separated into data groups on radius vectors which are different in value of $\theta$ from each other. In order to clearly show the above-mentioned, data on a radius vector making an angle $\theta$ with the $k_x$-axis, will be denoted by $S_\theta(t^\theta)$. By making Fourier transformation for both sides of the equation (13), we can obtain the following equation:

$$\zeta\{S_\theta(t^\theta)\} = \exp\left[-i2\pi f\frac{\theta}{\omega_G}\right]\left(\delta(f) - \frac{i}{\pi f}\right) * P_\theta(f) \quad (14)$$

where * indicates the convolution, and $P_\theta(f)$ is given by the following equation:

$$P_\theta(f) = \int \rho(x,y)\delta\left(f - \frac{\gamma}{2\pi}G_0(x\cos\theta + y\sin\theta)\right)dxdy. \quad (15)$$

In other words, $P_\theta(f)$ is the projection of $\rho(x,y)$ on a frequency axis in a direction making an angle $\theta$ with the $k_x$-axis. From the equations (13) and (14), we can obtain the following equation:

$$P_\theta(f) = Re\left\{e^{2\pi i f\frac{\theta}{\omega}}\zeta\{S_\theta(t^\theta)\}\right\}. \quad (16)$$

From the equation (16), we can obtain the projection of $\rho(x,y)$ on a frequency axis for an angle $\theta$. Further, the projections $P_\theta(f)$ corresponding to various values of $\theta$ within a range from 0° to 360° are used to reconstruct an image of spin distribution.

The image reconstruction is made in the following manner.

The function $P_\theta(f)$ is Fourier transformed with respect to f, as expressed by the following equation:

$$F_\theta(R) = \int_{-\infty}^{\infty} P_\theta(f)e^{2\pi i Rf}df. \quad (17)$$

By using the function $F_\theta(R)$, we can reconstruct the spin density $\rho(x,y)$ as follows:

$$\rho(x,y) = \int_0^{2\pi}\int_0^{+\infty} F_\theta(R)\exp[-2\pi i R(x\cos\theta + y\sin\theta)]RdRd\theta. \quad (18)$$

Usually, the calculation of the equation (18) is divided into two parts.

First, we calculate the following equation:

$$W(u) = \int_0^{+\infty} F_\theta(R) \cdot Re^{-2\pi i Ru}dR. \quad (19)$$

Then, we calculate the following equation:

$$\rho(x,y) = \int_0^{2\pi} W_\theta(x\cos\theta + y\sin\theta)d\theta. \quad (20)$$

The calculation of the equation (20) is called "back projection". In addition to the calculation of W(u) using the equations (16), (17) and (19), we can calculate the function $W_\theta(u)$ by the following equation:

$$W_\theta(u) = Re\left[e^{2\pi i u\frac{\theta}{\omega_G}}\int_0^{+\infty} S_\theta(R)Re^{-2\pi i uR}dR\right]. \quad (21)$$

According to the equation (21), the function $W_\theta(u)$ is calculated in such a manner that data on the spiral is divided into data groups on radial vectors which are different in value of $\theta$ from each other, is weighted in the direction of radius vector, and is then Fourier transformed. The number of Fourier transform operations per one value of $\theta$ in the image reconstruction using the equation (21) is smaller than the number of Fourier transform operations per one value of $\theta$ in the image reconstruction using the equations (16), (17) and (19), by two.

Figure 9:
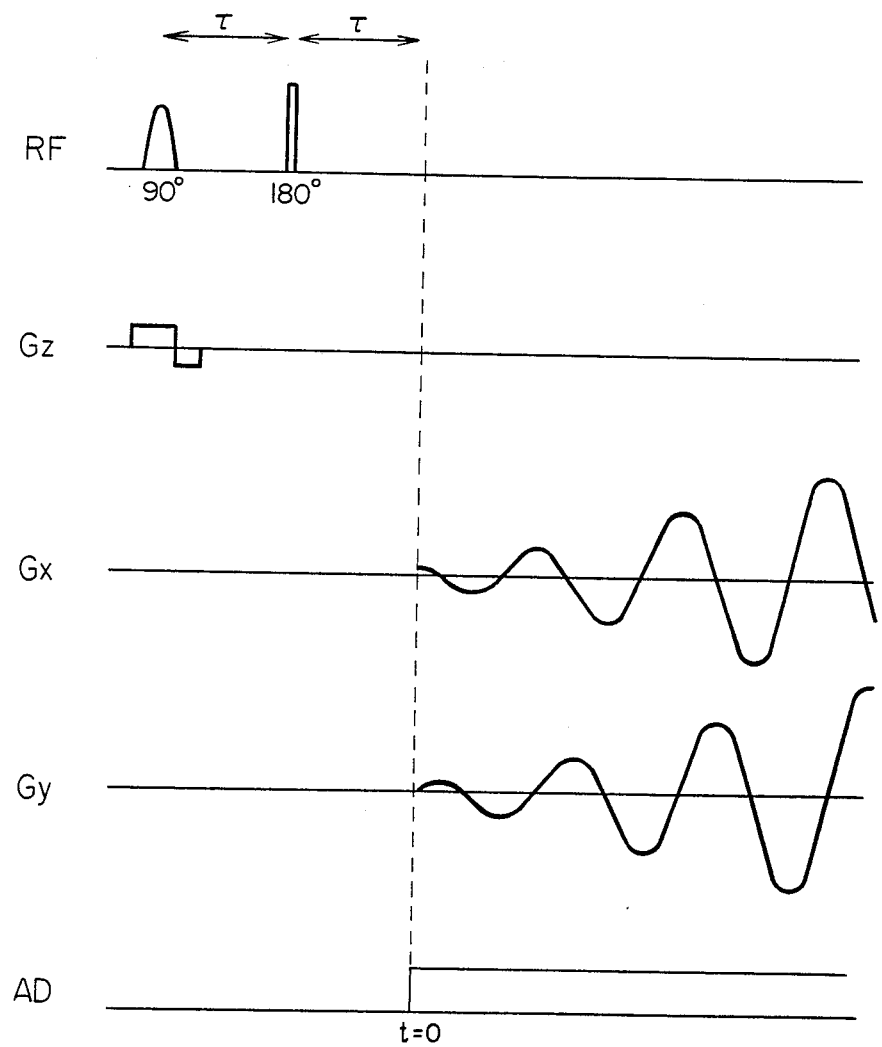
FIG. 9 is a time chart showing the measuring sequence of the embodiment in which the locus of FIG. 8 is formed.

FIG. 9 shows the measuring sequence of still another embodiment of an imaging method according to the present invention. In FIG. 9, reference symbol RF designates RF pulses, $G_Z$ the waveform of the field gradient in the Z-direction, $G_X$ the waveform of the field gradient in the X-direction, $G_Y$ the waveform of the field gradient in the Y-direction, and AD a signal sampling period.

Referring to FIG. 9, a 90° RF pulse and a field gradient $G_Z$ are first generated, to excite nuclear spins in a desired slice portion of an object to be inspected. When a time $\tau$ has elapsed after the peak of the 90° RF pulse, a 180° RF pulse is generated to form transverse magnetization when a time $\tau$ has elapsed after the 180° RF pulse, that is, at a time $t=0$. At the time $t=0$, the field gradients $G_x$ and $G_y$ given by the equations (8) are generated, and a signal sampling operation is started.

As already mentioned, a sampling interval $\Delta t$ is selected so as to satisfy an equation $\Delta t = 2\pi/\omega_G M$ (where M is an integer), and the nuclear magnetic resonance signal is divided into data groups $S_{\theta m}(t_n^{\theta m})$, where $m=0, 1, 2, 3, \text{---}, M-1$, and $n=0, 1, 2, 3, \text{---}, N-1$. That is, the above signal is divided into data groups on radius vectors which are different in value of $\theta$ from each other, and data on a radius vector indicated by an angle $\theta$ is expressed by $S_{\theta m}$. Further, $t_n^{\theta m}$ is given by the following equation:

$$t_n^{\theta m} = \frac{m\Delta\theta}{\omega_G} + \frac{2n\pi}{\omega_G}$$

where $\Delta\theta = 2\pi/M$.

The data group $S_{\theta m}(t_n^{\theta m})$ for each value of m is subjected to the discrete Fourier transformation with respect to n. Then, as shown in the equation (16), phase correction is made, and the real part of the function thus obtained is calculated to obtain $P_{\theta m}(f)$. The above processing is carried out for all values of m, and an image of spin distribution can be reconstructed from $P_{\theta n}(f)$ for each value of $\theta$, by the image reconstruction method which has been explained by using the equations (17) to (20) or the equation (21).

According to the above sequence, an image of spin distribution in the to-be-inspected object can be formed at ultra-high speed, not by generating the field gradient having a square waveform such as used in the conventional echo-planar method, but by generating the field gradient having a sinusoidal, periodic waveform. As is well known, in order to obtain a spin distribution image containing the effect of longitudinal relaxation time ($T_1$) distribution (namely, a $T_1$ enhanced image), a 180° RF pulse is generated, before a predetermined time has elapsed after the generation of a 90° RF pulse, to turn nuclear spins upside down previously, thereby forming the transverse magnetization containing the effect of longitudinal relaxation at a time $t=0$. Further, in a case where data is sampled from the NMR signal (namely, nuclear magnetic resonance signal) at an interval different from $\Delta t = 2\pi/\omega_G M$, data on radius vectors indicated by $\theta_m$ (where $m=0, 1, 2, 3, \text{---}, M-1$) are determined from the sampled data by interpolation, and are then Fourier transformed.

The above-mentioned image reconstruction techniques can be modified in various manners. According to one of the modified versions, the projection after convolution is directly obtained by weighting the function $S_\theta(t^\theta)$, without using the equation (16). In more detail, when the convolution weight is expressed by $\psi(t)$, the projection $W_\theta(f)$ after convolution is given by the following equation:

$$W_\theta(f) = Re\left\{ e^{2\pi i f \frac{\theta}{\omega_G}} \zeta\{\psi(t)S_\theta(t^\theta)\} \right\} \quad (22)$$

The above equation (22) corresponds to the equation (21). The influence of the transverse relaxation on the image reconstruction can be lessened in a certain degree by setting the weight $\psi(t)$ so that a relation $\psi(t) \propto t \exp(1/\overline{T}_2)$ is satisfied, where $\overline{T}_2$ indicates the mean value of transverse relaxation $T_2$ in a sample.

While, in a case where the non-uniformity of static field in the field of view cannot be neglected, the effect of the non-uniformity can be corrected by modifying the image reconstruction procedure.

In a case where the non-uniformity of static field in the field of view has to be taken into consideration and is given by $E(x,y)$, the equation (9) is rewritten as follows:

$$S'(t) = \int \rho(x,y) \exp[i\gamma\{G_0 t(x\cos\omega_G t + y\sin\omega_G t + E(x,y)t)\}] dxdy \ldots \quad (9)'.$$

Accordingly, the equation (16) is rewritten as follows:

$$P_{\theta'}(f) = Re\left\{ e^{2\pi i f \frac{\theta}{\omega_G}} \zeta[S'(t_n^\theta)] \right\} .$$

Further, the equation (15) is rewritten as follows:

$$P_{\theta'}(f) = \quad (15)'$$

$$\int \rho(x,y)\delta\left[ f - \frac{\gamma}{2\pi} G_0(x\cos\theta + y\sin\theta) - \frac{\gamma}{2\pi} E(x,y) \right] dxdy.$$

Figure 11:
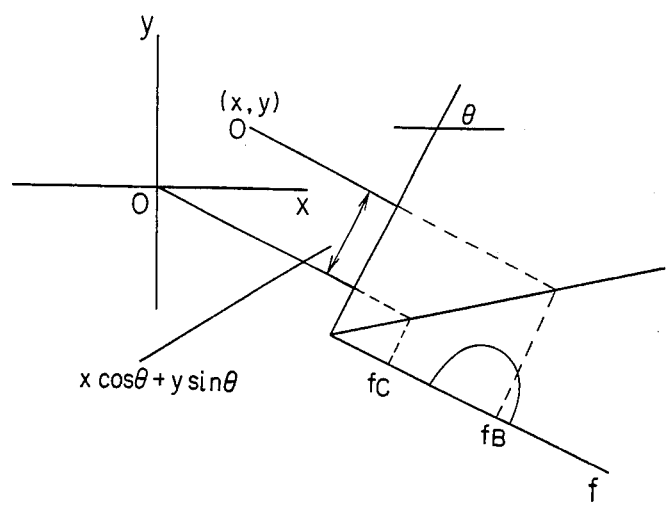
FIG. 11 is a schematic diagram showing a relation in back projection between an image plane and a frequency axis.

The equation (15)' shows that projected data is frequency shifted by an amount $E(x,y)$. The above shift can be corrected by selecting data in an image reconstruction process, while taking $E(x,y)$ into consideration. This correction will be explained below. FIG. 11 shows a relation between the image plane and the frequency axis, in an image reconstruction process. In FIG. 11, reference symbol $f_c$ designates a resonance frequency at the center of the field of view. In ordinary back projection, as shown in FIG. 11, data which is back projected onto a point (x,y), is obtained at a frequency coordinate $f_B$, which is given by the following equation:

$$f_B = \gamma G(x\sin\theta + y\cos\theta)/2\pi + f_O.$$

In a case where the non-uniformity of static field is present, however, the resonance frequency at the point (x,y) is not equal to $f_B$, but is equal to $f_B'(=f_B+f_e)$. Accordingly, when the non-uniformity of static field is previously known, the effect of the non-uniformity can be corrected by substituting $f_B'$ for $f_B$ in the coordinate calculation of back projection.

In the above, explanation has been made of an image reconstruction method using $P_\theta(f)$ for various values of $\theta$ within a range from 0° to 360°. However, when $P_\theta(f)$ is formed in such a manner that $S_\theta(t_n{}^\theta)$ and $S_{\theta+\pi}(t_n{}^{\theta+\pi})$ are combined with each other and then Fourier transformed, the image reconstruction can be made by using $P_\theta(f)$ for values of $\theta$ within a range from 0° to 180°. It is to be noted that, as shown in FIG. 8, measuring points for $S_\theta(t_n{}^\theta)$ and $S_{\theta+\pi}(t_n{}^{\theta+\pi})$ are arranged at irregular intervals, in the neighborhood of the origin. Accordingly, it is necessary to estimate data arranged at regular intervals, by interpolation.

When the radius of the field of view is expressed by R, and T is defined by an equation $\omega_G=2\omega/T$, there is the following relation:

$$\frac{\gamma}{2\pi} G_0 T = \frac{1}{2R} . \tag{23}$$

When an image matrix includes $J \times J$ elements, a resolution $\Delta\gamma(=R/J)$ is also expressed by the following equation:

$$\Delta\gamma = \frac{\pi}{\gamma G_0 t_{max}} . \tag{24}$$

Thus, we can obtain the following equation:

$$t_{max} = \frac{J}{2} T. \tag{25}$$

In this case, the maximum amplitude $G_{max}$ of the field gradients $G_x$ and $G_y$ is given by the following equation:

$$G_{max} = G_0 \omega_G t_{max} = \pi J G_0 \ldots \tag{26}$$

For example, in a case where R is 15 cm, T is 0.25 mS, and J is 128, $G_O$ and $G_{max}$ are equal to 0.016 gauss/cm and 6.4 gauss/cm, respectively. It is very difficult to realize the combination of the above values of T and $G_{max}$ by an actual apparatus.

In order to solve the above problem, field gradients $G_x$ and $G_y$ are used which are given by the following equations:

$$\begin{aligned}G_x(t) &= G_0\cos(\omega_G t + \phi) - G_0\omega_G t\sin(\omega_G t + \phi) \\ G_y(t) &= G_0\sin(\omega_G t + \phi) + G_0\omega_G t\sin(\omega_G t + \phi)\end{aligned} \tag{28}$$

Figure 10:
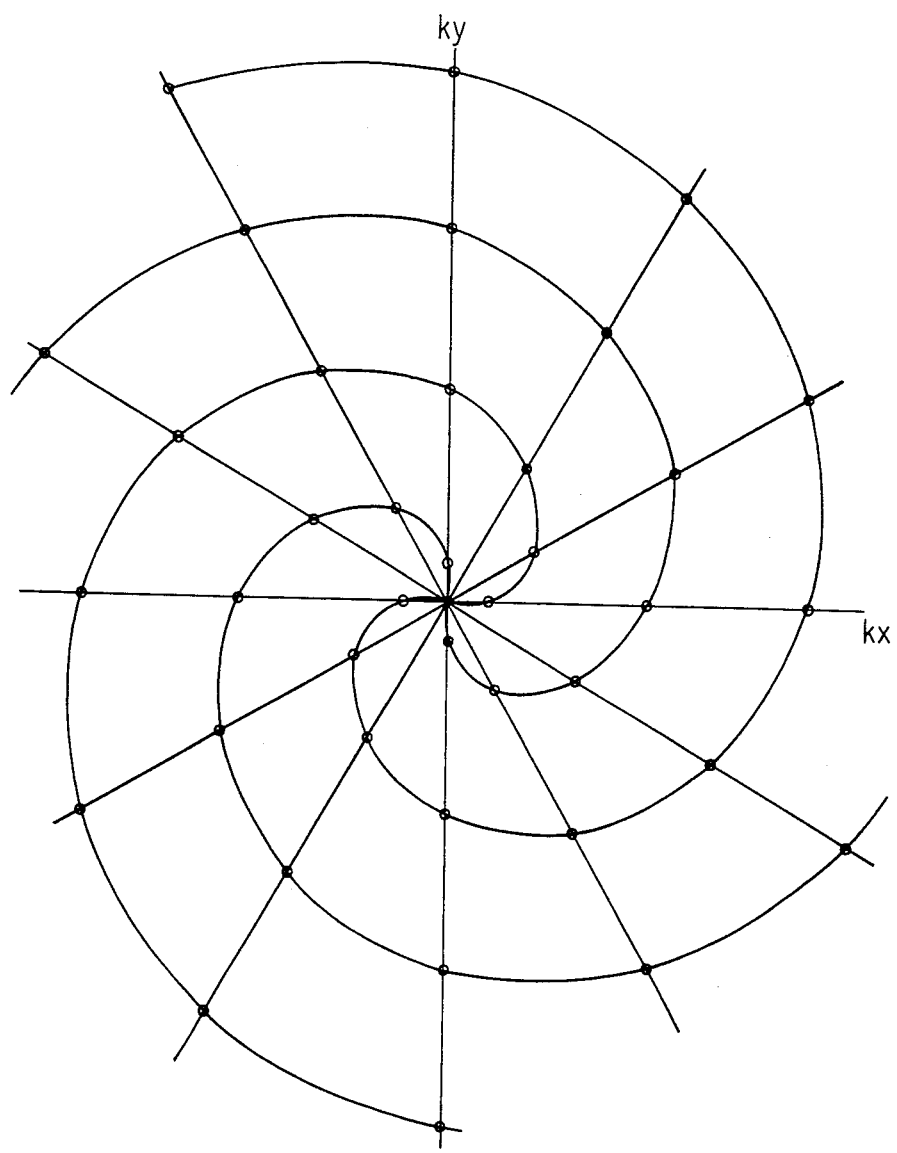
FIG. 10 is a schematic diagram showing those loci of the position of signal in a phase space which are formed in a still further embodiment of an imaging method according to the present invention.

For many values of the phase $\phi$ which are arranged at regular intervals, the measuring sequence of FIG. 9 is repeated, to obtain data on a plurality of spirals which are arranged at regular intervals. Thereafter, as explained in the embodiment of FIG. 9, the above data is divided into data groups on a plurality of radius vectors which are different in value of $\theta$ from each other, and the data group on each radius vector is Fourier transformed, to be used for image reconstruction. FIG. 10 shows a case where data is sampled from four spirals which are formed by successively changing the value of $\phi$ by $\pi/2$.

When the image reconstruction is carried out by using D spirals, the factors $t_{max}$ and $G_{max}$ are given by the following equations:

$$\begin{aligned}t_{max} &= \frac{J}{2D} T \\ G_{max} &= \frac{1}{D} \pi J G_0\end{aligned} \tag{29}$$

Thus, $G_{max}$ is one-Dth of the value in a case where only one spiral is used.

Figure 12:
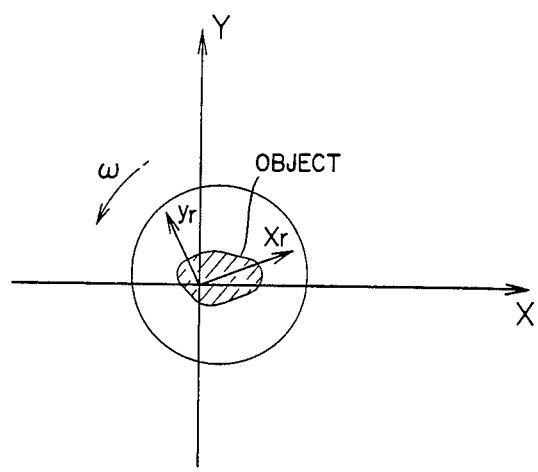
FIG. 12 is a schematic diagram showing coordinate systems used for measuring a rotatable object.
Figure 13:
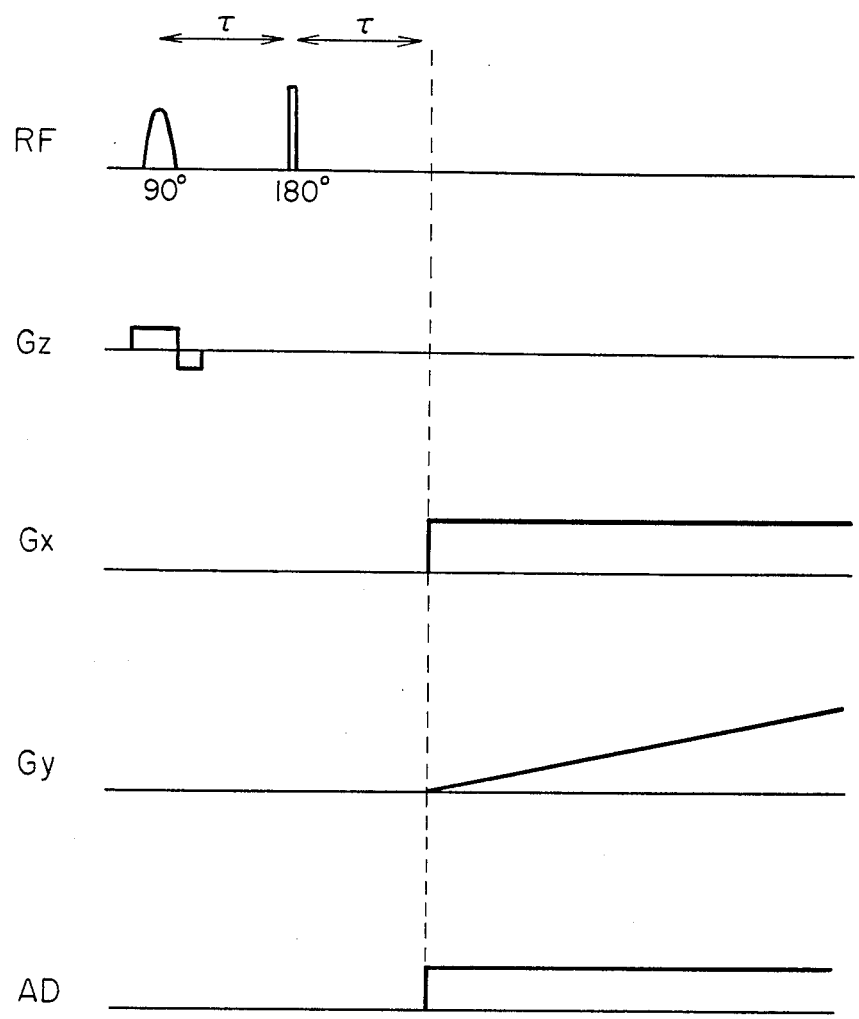
FIG. 13 is a time chart showing a measuring sequence used for measuring the rotatable object of FIG. 12.

Further, in a case where an object to be inspected can be rotated as in an NMR microscope, the present invention is readily carried out. FIG. 12 shows such a case. Referring to FIG. 12, the to-be-inspected object is rotatable about the center of the field of view, and a coordinate system fixed to a laboratory is denoted by (x,y). In this case, as shown in FIG. 13, the field gradients $G_x$ and $G_y$ shown in FIG. 9 are replaced by field gradients $G_x$ and $G_y$ which are expressed by the following equations:

$$\begin{aligned}G_x &= G_0 \\ G_y &= G_0\omega_r t\end{aligned} \tag{30}$$

That is, one of field gradients $G_x$ and $G_y$ is kept constant, and the other varies linearly with time. The to-be-inspected object is rotated at an angular frequency corresponding to the quotient obtained by dividing the proportional constant of the other field gradient by the value of one field gradient. When a coordinate system fixed to the rotating, to-be-inspected object is expressed by $(x_r, y_r)$, an NMR signal S(t) is given by the following equation:

$$S(t) = \int \rho(x_r,y_r)\exp\left[i\gamma\left\{\int_0^t G_0 x dt' + \int_0^t G_0\omega_r t y dt'\right\}\right] dx_r dy_r \tag{31}$$

When the equation (31) is rewritten by using the following equations:

$$\begin{aligned}x &= x_r\cos\omega_r t + y_r\sin\omega_r t \\ y &= -x_r\sin\omega_r t + y_r\cos\omega_r t\end{aligned} \tag{32}$$

we can obtain the following equation:

$$S(t) = \int \rho(x_r,y_r)\exp\left[i\gamma\left\{G_0 x_r \int_0^t (\cos\omega_r t' - \omega t'\sin\omega_r t')dt' + G_0 y_r \int_0^t (\sin\omega_r t' + \omega_r t'\cos\omega_r t')dt'\right\}\right] dx_r dy_r \tag{33}$$

Further, the equation (33) can be rewritten as follows:

$$S(t) = \int \rho(x_r,y_r)\exp(i\gamma\{x_r G_0 t \cos\omega_r t + y_r G_0 t \sin\omega_r t\}) dx_r dy_r \ldots \tag{34}$$

That is, the same spiral sampling as shown in FIG. 8 can be carried out by rotating the to-be-inspected object and using the field gradients $G_x$ and $G_y$ of FIG. 13. Accordingly, by making a sampling interval for the NMR signal equal to a value obtained by dividing a rotational period of the to-be-inspected object by an integral number, and by carrying out the separation of sampled data into data groups and the image reconstruction processing in the same manner as in the embodiment of FIG. 9, an image of the spin distribution in the to-be-inspected object is formed. In a case where the sampling interval for the NMR signal is different from a value obtained by dividing the rotational interval of the to-be-inspected object by an integral number, data corresponding to the above value are calculated by interpolation, and then the separation of calculated data into data groups and the image reconstruction are carried out.

Further, when the field gradients $G_x$ and $G_y$ of FIG. 13 are generated at different rotational phases of the to-be-inspected object and a measuring operation is performed for each case, sampled data is arranged on a plurality of spirals such as shown in FIG. 10. As has been already explained, such sampled data can be used to form an image of spin distribution.

In the embodiments which have been explained by reference to FIGS. 7 to 13, a phase space (Fourier space) is sampled on a spiral, and thus data necessary for image reconstruction can be obtained at high speed without using a field gradient which oscillates at a high frequency and has a rectangular waveform. Accordingly, these embodiments can alleviate a difficulty in a conventional apparatus for observing the spin distribution or relaxation time distribution non-destructively.

In the foregoing, the two-dimensional spin mapping according to the present invention has been explained, by way of example. It is a matter of course that the measuring principle of the present invention can be readily applied to the three-dimensional spin mapping.

We claim:

1. A nuclear magnetic resonance imaging method comprising:
   a first step of preparing transverse magnetization in a desired portion of an object to be inspected, said to-be-inspected object being disposed in a uniform, static magnetic field;
   a second step of generating a field gradient in a predetermined direction to translate the position of signal in a phase space, from the origin thereof; and
   a third step of generating a rotating field gradient to perform a measuring operation while rotating the position of signal in the phase space.

2. A nuclear magnetic resonance imaging method according to claim 1, wherein the position of signal in the phase space rotates a plurality of times continuously, and measured data obtained for every rotation are summed up.

3. A nuclear magnetic resonance imaging method according to claim 1, wherein said first, second and third steps are repeated while successively varying at least one of the intensity and the rotational speed of said rotating field gradient, to measure a signal on a plurality of concentric circles formed in said phase space.

4. A nuclear magnetic resonance imaging method according to claim 1, wherein, after said first step, said second and third steps are repeated continuously while varying one of the intensity and the rotational speed of said rotating field gradient, to measure a signal on a plurality of concentric circles formed in said phase space.

5. A nuclear magnetic resonance imaging method according to claim 4, wherein each rotation of the position of signal in the phase space is the rotation in a 180° arc.

6. A nuclear magnetic resonance imaging method according to claim 4, wherein said second and third steps are repeated so that said signal on the outermost circle of said concentric circles is first measured and said signal on the innermost circle is measured last.

7. A nuclear magnetic resonance imaging method comprising:
   a first step of preparing transverse magnetization in a desired portion of an object to be inspected, said to-be-inspected object being disposed in a uniform, static magnetic field;
   a second step of generating a field gradient in a predetermined direction, to translate the position of signal in a phase space, from the origin thereof;
   a third step of generating a rotating field gradient to rotate the position of signal in the phase space, and performing a sampling operation for a signal successively, while varying at least one of the intensity and the rotational speed of the rotating field gradient at each rotation, to obtain signals arranged on a plurality of concentric circles which are formed in said phase space;
   a fourth step of Fourier-transforming said signals obtained in said third step in radial directions of said phase space, to obtain a plurality of projections; and
   a fifth step of reconstructing two-dimensional data, from said projections obtained in said fourth step.

8. A nuclear magnetic resonance imaging method comprising:
   a first step of preparing transverse magnetization in a desired portion of an object to be inspected, said to-be-inspected object being disposed in a uniform, static magnetic field;
   a second step of generating a field gradient in a predetermined direction, to translate the position of signal in a phase space, from the origin thereof;
   a third step of generating a rotating field gradient to rotate the position of signal in the phase space, and performing a sampling operation for a signal successively, while varying at least one of the intensity and the rotational speed of the rotating field gradient at each rotation, to obtain signals arranged on a plurality of concentric circles which are formed in the phase space;
   a fourth step of obtaining data trains which are arranged on rectangular coordinate points in the phase space, from the signals obtained in said third step, by interpolation; and
   a fifth step of causing said data trains obtained in said fourth step, to undergo a Fourier transformation.

9. A nuclear magnetic resonance imaging method comprising:
   a first step of preparing transverse magnetization in a desired portion of an object to be inspected, said to-be-inspected object being disposed in a substantially-uniform, static magnetic field;
   a second step of sampling a signal resulting from the transverse magnetization, in a state that a gradient field is superposed on said uniform, static magnetic field, said gradient field having an oscillating waveform formed of the combination of sine and cosine functions; and a third step of reconstructing a spin distribution image from said sample signal;

wherein the period of said sine and cosine functions making up said oscillating waveform is an integral multiple of a sampling interval, at which a sampling operation is performed for the signal sampled in said second step.

10. A nuclear magnetic resonance imaging method according to claim 9, wherein said gradient field includes a first gradient field component along a first direction oscillated by a first waveform of said sine function and a second gradient field component along a second direction perpendicular to said first direction oscillated by a second waveform of said cosine function so that the integration of the combination of said first and second waveforms of the combination of said sine and cosine functions draws a spiral in a phase space.

11. A nuclear magnetic resonance imaging method comprising:

a first step of preparing transverse magnetization in a desired portion of an object to be inspected, said to-be-inspected object being disposed in a substantially-uniform, static magnetic field;

a second step of measuring a signal resulting from the transverse magnetization, in a state that a gradient field is superposed on said uniform, static magnetic field, said gradient field having an oscillating waveform formed of the combination of sine and cosine functions, and signal appearing at an interval, equal to a value which is obtained by dividing the period of said sine and cosine functions making up said oscillating waveform by an integer, are calculated, by interpolation, from signals which are obtained by a sampling operation for the measured signal; and a third step of reconstructing a spin distribution image from said interpolated signals.

12. A nuclear magnetic resonance imaging method according to claim 11, wherein said gradient field includes a first gradient field component along a first direction oscillated by a first waveform of said sine function and a second gradient field compoent along a second direction perpendicular to said first direction oscillated by a second waveform of said cosine function so that the integration of the combination of said first and second waveforms of the combination of said sine and cosine functions draws a spiral in a phase space.

13. A nuclear magnetic resonance imaging method according to claim 12, wherein said third step includes sub-steps of dividing data at measuring points arranged on said spiral into one-dimensional data groups on a plurality of radius vectors in said phase space, weighting each one-dimensional data group to cause the weighted data group to undergo a Fourier transformation, and back-projecting the result of the Fourier transformation to reconstruct an image of spin distribution.

14. A nuclear magnetic resonance imaging method according to claim 13, wherein in the back projection, coordinates of back-projected data are calculated, with the aid of data on the distribution of static magnetic field in the field of view.

15. A nuclear magnetic resonance imaging method comprising:

a first step of preparing transverse magnetization in a desired portion of an object to be inspected, said to-be-inspected object being disposed in a substantially-uniform, static magnetic field;

a second step of measuring a signal resulting from the transverse magnetization while rotating said to-be-inspected object, in a state that a gradient field is superposed on said static magnetic field, said gradient field being formed of a first gradient field component and a second gradient field component perpendicular thereto, the intensity of said first gradient field component being kept constant, the intensity of said second gradient field component being increased linearly with time; and a third step of reconstructing a spin distribution image from said measured signal.

16. A nuclear magnetic resonance imaging method according to claim 15, wherein the integral of said field gradient draws a spiral in a phase space with respect to said rotating, to-be-inspected object.

* * * * *